(12) United States Patent
Lee et al.

(10) Patent No.: US 9,515,054 B2
(45) Date of Patent: Dec. 6, 2016

(54) SEMICONDUCTOR DEVICE AND STACKED SEMICONDUCTOR PACKAGE HAVING THE SAME

(71) Applicant: SK hynix Inc., Icheon-si, Gyeonggi-do (KR)

(72) Inventors: Jin Hui Lee, Seoul (KR); Taek Joong Kim, Seoul (KR)

(73) Assignee: SK HYNIX INC., Icheon-si (KR)

( * ) Notice: Subject to any disclaimer, the term of this patent is extended or adjusted under 35 U.S.C. 154(b) by 260 days.

(21) Appl. No.: 13/705,008

(22) Filed: Dec. 4, 2012

(65) Prior Publication Data

US 2014/0015110 A1   Jan. 16, 2014

(30) Foreign Application Priority Data

Jul. 11, 2012  (KR) ........................ 10-2012-0075577

(51) Int. Cl.
*H01L 23/34* (2006.01)
*H01L 25/07* (2006.01)
*H01L 23/367* (2006.01)
*H01L 23/373* (2006.01)
*H01L 23/36* (2006.01)

(52) U.S. Cl.
CPC ........... *H01L 25/071* (2013.01); *H01L 25/074* (2013.01); *H01L 23/36* (2013.01); *H01L 23/367* (2013.01); *H01L 23/3731* (2013.01); *H01L 2224/16145* (2013.01); *H01L 2224/48091* (2013.01); *H01L 2924/15311* (2013.01)

(58) Field of Classification Search
CPC .. H01L 23/36; H01L 23/367; H01L 23/3731
USPC ........ 257/686, 698, E23.104, 706, 707, 712; 438/462, 122
See application file for complete search history.

(56) References Cited

U.S. PATENT DOCUMENTS

| | | | | |
|---|---|---|---|---|
| 6,066,512 A | * | 5/2000 | Hashimoto | ....... H01L 23/49572 257/701 |
| 7,649,249 B2 | * | 1/2010 | Noguchi | ....................... 257/686 |
| 8,455,301 B2 | * | 6/2013 | Lee et al. | ...................... 438/109 |
| 2004/0251540 A1 | * | 12/2004 | Eguchi et al. | ................ 257/713 |
| 2008/0246137 A1 | * | 10/2008 | Mahler | ............. H01L 23/49524 257/690 |
| 2009/0140402 A1 | * | 6/2009 | Ohtani | .......................... 257/675 |
| 2009/0184414 A1 | * | 7/2009 | Park et al. | ..................... 257/698 |
| 2010/0053956 A1 | * | 3/2010 | Park et al. | ..................... 362/235 |
| 2011/0215453 A1 | * | 9/2011 | Eng et al. | ...................... 257/666 |
| 2011/0298120 A1 | * | 12/2011 | Pagaila et al. | ................ 257/698 |
| 2011/0304038 A1 | * | 12/2011 | Lee | ................................. 257/698 |
| 2012/0025354 A1 | * | 2/2012 | Sasaki | ................... H01L 21/561 257/620 |
| 2012/0088332 A1 | * | 4/2012 | Lee | ....................... H01L 21/561 438/113 |
| 2012/0171814 A1 | * | 7/2012 | Choi et al. | .................... 438/107 |

* cited by examiner

*Primary Examiner* — Kimberly Rizkallah
*Assistant Examiner* — Maria Ligai
(74) *Attorney, Agent, or Firm* — William Park & Associates Ltd.

(57) ABSTRACT

A semiconductor device includes a plurality of semiconductor chips connected through a scribe lane; a plurality of through electrodes formed in each of the plurality of semiconductor chips; a heat dissipation member formed in the scribe lane; and heat transfer members connecting the through electrodes with the heat dissipation member.

16 Claims, 11 Drawing Sheets

SEMICONDUCTOR DEVICE AND STACKED SEMICONDUCTOR PACKAGE HAVING THE SAME

CROSS-REFERENCE TO RELATED APPLICATIONS

The present application claims priority under 35 U.S.C. 119(a) to Korean Patent Application Number 10-2012-0075577 filed in the Korean Intellectual Property Office on Jul. 11, 2012, which is incorporated herein by reference in its entirety.

BACKGROUND

1. Field of the Invention

The present invention generally relates to a semiconductor device, and more particularly, to a semiconductor device suitable for improving a heat dissipation characteristic and a stacked semiconductor package having the same.

2. Description of the Related Art

A semiconductor chip capable of storing and processing a huge amount of data within a short time and a semiconductor package including the semiconductor chip have been developed. Recently, the development of a stacked semiconductor package, in which at least two semiconductor chips are stacked using through electrodes so as to improve not only a data storage capacity but also a data processing speed, has been actively progressed.

In such stacked semiconductor package using through electrodes, a substantial amount of heat is generated from the through electrodes through which signal transfer is implemented. However, since a plurality of semiconductor chips are placed close to one another and a molding part surrounds the semiconductor chips, the heat generated from the through electrodes is not properly discharged. As a consequence, as a thermal damage is applied to the semiconductor chips, the performance and the reliability of the stacked semiconductor package may be degraded.

SUMMARY

Various embodiments are directed to a semiconductor package having an improved heat dissipation characteristic.

Also, an embodiment is directed to a stacked semiconductor package having the semiconductor package.

In an embodiment, a semiconductor device includes: a plurality of semiconductor chips connected through a scribe lane; a plurality of through electrodes formed in each of the plurality of semiconductor chips; a heat dissipation member formed in the scribe lane; and heat transfer members connecting the through electrodes with the heat dissipation member.

The plurality of semiconductor chips may be connected in line. Unlike this, the plurality of semiconductor chips may be connected in a matrix type.

The heat dissipation member may include: through parts passing through one surface of the scribe lane and the other surface of the scribe lane which faces away from the one surface; and a heat dissipation part formed over the scribe lane and connected with the through parts.

The heat dissipation part may be formed over any one of the one surface and the other surface of the scribe lane.

The semiconductor device may further include a recess defined as at least any one of the one surface of the scribe lane and the other surface of the scribe lane facing away from the one surface is etched by a partial thickness, and the recess may be filled with the heat dissipation part.

The through parts may be formed in a plural member such that the through parts are individually correspond to the plurality of through electrodes which are formed in each of the plurality of semiconductor chips. And, the heat dissipation part may be connected with all of the plurality of through parts.

Unlike this, the through parts may be formed as one member along a lengthwise direction of the scribe lane to correspond to all of the plurality of through electrodes which are formed in each of the plurality of semiconductor chips.

The heat dissipation member may project from at least any one of the one surface of the scribe lane and the other surface of the scribe lane facing away from the one surface. The heat dissipation member comprises an aluminum nitride.

The heat transfer members may be formed in a plural number such that the plurality of through electrodes which are formed in each of the plurality of semiconductor chips are individually connected to the heat dissipation member. Unlike this, the heat transfer members may be formed as one member such that the plurality of through electrodes which are formed in each of the plurality of semiconductor chips are connected to the heat dissipation member all at once.

The heat transfer members may be formed in the semiconductor chips and may include any one of copper, a conductive alloy, and ceramic.

In an embodiment, a stacked semiconductor package includes: semiconductor devices each including a plurality of semiconductor chips connected through a scribe lane, a plurality of through electrodes formed in each of the plurality of semiconductor chips, a heat dissipation member formed in the scribe lane, and heat transfer member connecting the through electrodes with the heat dissipation member, the semiconductor devices being stacked such that their through electrodes and heat dissipation members are connected with one another; and connection members electrically connecting the through electrodes of the stacked semiconductor devices.

The stacked semiconductor package may further include an additional heat dissipation member mounted to an uppermost semiconductor device among the stacked semiconductor devices.

The connection members may comprise solders.

The stacked semiconductor package may further comprise adhesive members formed between the stacked semiconductor devices. The adhesive members may comprise non-conductive paste.

The stacked semiconductor package may further comprise a structural body comprising connection electrodes electrically connected to the through electrodes of a lowermost semiconductor device by way of connection members. The structural body comprises a printed circuit board. Unlike this, the structural body comprises an interposer.

The stacked semiconductor package may further comprise a structural body comprising connection electrodes electrically connected to the through electrodes of a lowermost semiconductor device by way of a medium of connection members. The structural body comprises a semiconductor package.

DETAILED DESCRIPTION

Figure 1:
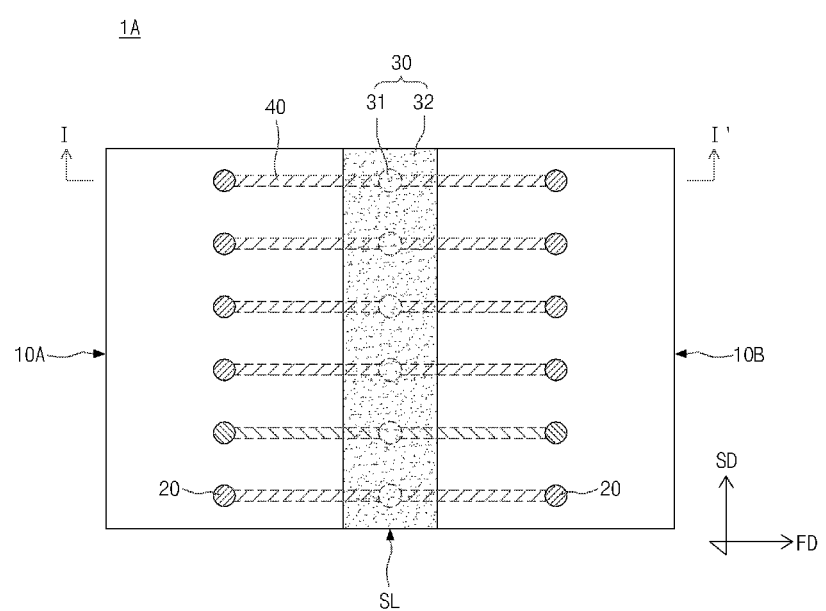
FIG. 1 is a plan view illustrating a semiconductor device in accordance with an embodiment.

Hereafter, various embodiments will be described in detail with reference to the accompanying drawings.

It is to be understood herein that the drawings are not necessarily to scale and in some instances proportions may have been exaggerated in order to more clearly depict certain features of the invention. Also, the same reference numerals or the same reference designators may denote the same elements throughout the specification.

Figure 2:
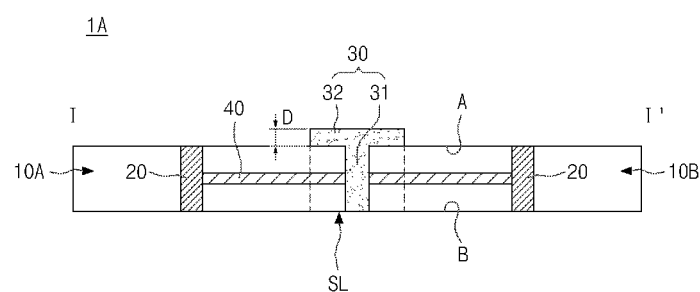
FIG. 2 is a cross-sectional view taken along the line I-I' of FIG. 1.

FIG. 1 is a plan view illustrating a semiconductor device in accordance with an embodiment, and FIG. 2 is a cross-sectional view taken along the line I-I' of FIG. 1.

Referring to FIGS. 1 and 2, a semiconductor device 1A in accordance with an embodiment may include a plurality of semiconductor chips 10A and 10B, through electrodes 20, a heat dissipation member 30, and heat transfer members 40.

In an embodiment associated with FIGS. 1 and 2, the plurality of semiconductor chips 10A and 10B may include a first semiconductor chip 10A and a second semiconductor chip 10B which may be connected in line through a scribe lane SL. That is to say, the first semiconductor chip 10A, the scribe lane SL and the second semiconductor chip 10B may be connected in line along a first direction FD which is defined in FIG. 1.

A plurality of through electrodes 20 may be formed in each of the semiconductor chips 10A and 10B. In an embodiment associated with FIG. 1, the plurality of through electrodes 20 may be formed in line in each of the semiconductor chips 10A and 10B along a second direction SD defined in FIG. 1.

While not shown, a circuit block constituted by transistors, capacitors, resistors, etc. for storing, processing and transmitting data may be formed in each of the semiconductor chips 10A and 10B. The through electrodes 20 are electrically connected with the circuit block.

The heat dissipation member 30 may include through parts 31 and a heat dissipation part 32.

The through parts 31 pass through one surface A of the scribe lane SL and the other surface B of the scribe lane SL which faces away from the one surface A. In an embodiment associated with FIG. 1, a plurality of through parts 31 may be formed to individually correspond to the plurality of through electrodes 20 which may be formed in each of the semiconductor chips 10A and 10B.

The heat dissipation part 32 may be formed on the one surface A of the scribe lane SL. The heat dissipation part 32 may be formed in a line type along the lengthwise direction of the scribe lane SL to be connected with all of the plurality of through parts 31. The heat dissipation member 30 may be formed of an insulative heat dissipation substance, for example, an aluminum nitride.

The heat dissipation part 32 may be formed to project by a predetermined height D from the one surface A of the scribe lane SL, such that, when constructing a stacked semiconductor package by stacking semiconductor devices 1A, heat dissipation members 30 of upper and lower semiconductor devices 1A can be connected with each other.

Although it was illustrated and explained in an embodiment associated with FIG. 1 that the heat dissipation part 32 of the heat dissipation member 30 projects from the one surface A of the scribe lane SL, it is to be noted that the various embodiments are not limited to such and may include all cases in which the heat dissipation member 30 projects from at least any one of the one surface A and the other surface B of the scribe lane SL.

The heat transfer members 40 may be disposed in each of the semiconductor chips 10A and 10B. The heat transfer members 40 may be connected between the through electrodes 20 formed in each of the semiconductor chips 10A and 10B and the heat dissipation member 30, and transfer the heat generated from the through electrodes 20 to the heat dissipation member 30. In an embodiment associated with FIG. 1, a plurality of heat transfer members 40 may be formed such that the through electrodes 20 formed in each of the semiconductor chips 10A and 10B are individually connected to the heat dissipation member 30. Copper and a conductive alloy may be used as the material of the heat transfer members 40. Additionally, ceramic may be used.

Figure 3:
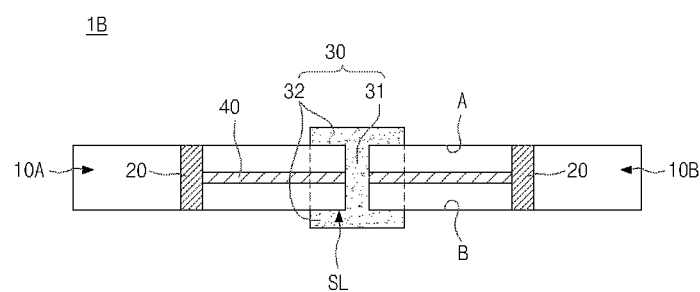
FIG. 3 is a cross-sectional view illustrating a semiconductor device in accordance with an embodiment.

FIG. 3 is a cross-sectional view illustrating a semiconductor device in accordance with an embodiment.

The semiconductor device 1B in accordance with an embodiment associated with FIG. 3 has a construction that the heat dissipation part 32 in the semiconductor device 1A in accordance with an embodiment described above with reference to FIGS. 1 and 2 is changed. Accordingly, the semiconductor device 1B in accordance with an embodiment associated with FIG. 3 has substantially the same construction as the semiconductor device 1A in accordance with an embodiment associated with FIG. 1 except the heat dissipation part 32. Therefore, repeated descriptions for the same component parts will be omitted herein, and the same terms and the same reference numerals will be used to refer to the same component parts.

Referring to FIG. 3, in an embodiment, a heat dissipation part 32 may be formed on one surface A and the other surface B of a scribe lane SL.

According to an embodiment associated with FIG. 3, since the heat dissipation part 32 may be formed on not only the one surface A but also the other surface B of the scribe lane SL, the area of a heat dissipation member 30 which is exposed to an outside is increased, by which improved heat dissipation characteristics may be accomplished.

Figure 4:
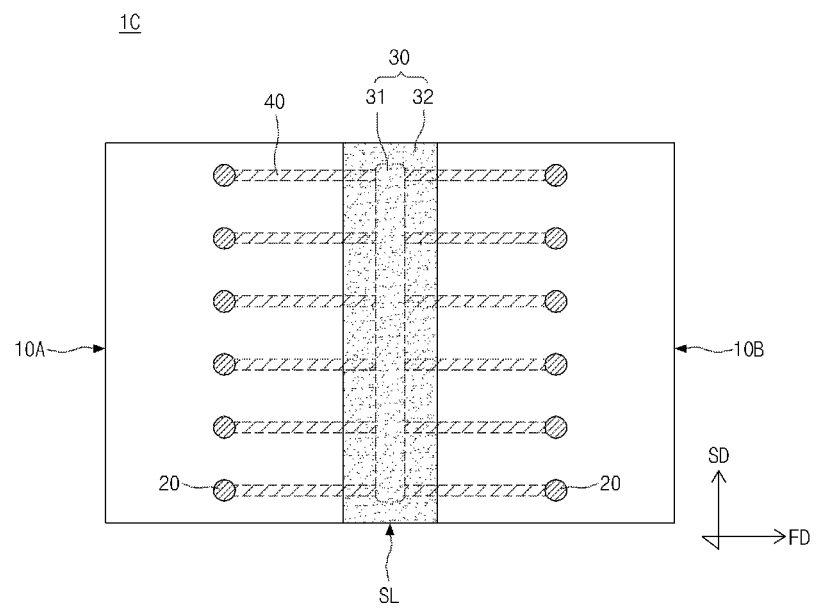
FIG. 4 is a plan view illustrating a semiconductor device in accordance with an embodiment.

FIG. 4 is a plan view illustrating a semiconductor device in accordance with an embodiment.

The semiconductor device 1C in accordance with an embodiment has a construction where the shape of the through parts 31 in the semiconductor device 1A in accordance with an embodiment described above with reference to FIGS. 1 and 2 is changed. Accordingly, the semiconductor device 1C in accordance with an embodiment associated with FIG. 4 has substantially the same construction as the semiconductor device 1A in accordance with an embodiment associated with FIG. 1 except for the through part 31. Therefore, repeated descriptions for the same component parts will be omitted herein, and the same terms and the same reference numerals will be used to refer to the same component parts.

Referring to FIG. 4, in an embodiment, a through part 31 may be formed as one member which extends along the lengthwise direction of the scribe lane SL to correspond to all of a plurality of through electrodes 20 formed in each of semiconductor chips 10A and 10B.

According to an embodiment associated with FIG. 4, since the through part 31 is not divided into a plurality of members and may be formed as one member, the pattern size of the through part 31 increases. Therefore, since a costly high precision process is not needed, the manufacturing cost may be reduced.

While it was illustrated and explained in the embodiments described above with reference to FIGS. 1 to 4 that the through parts 31 may be formed to individually correspond to the plurality of through electrodes 20 formed in each of the semiconductor chips 10A and 10B or the through part 31 may be formed to correspond to all of the plurality of through electrodes 20 formed in each of the semiconductor chips 10A and 10B, it is to be noted that the embodiments are not limited to such. For example, through parts 31 may be formed each to correspond to some through electrodes 20 of the plurality of through electrodes 20 formed in each of the semiconductor chips 10A and 10B.

Figure 5:
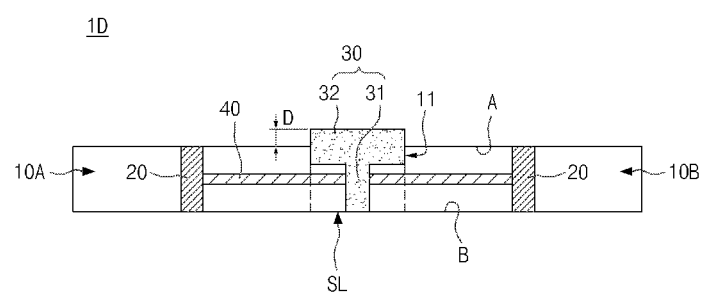
FIG. 5 is a cross-sectional view illustrating a semiconductor device in accordance with an embodiment.

FIG. 5 is a cross-sectional view illustrating a semiconductor device in accordance with an embodiment.

The semiconductor device 1D in accordance with an embodiment has a construction that a recess 11 is added to the construction of the semiconductor device 1A in accordance with an embodiment described above with reference to FIGS. 1 and 2. Accordingly, the semiconductor device 1D in accordance with an embodiment associated with FIG. 5 has substantially the same construction as the semiconductor device 1A in accordance with an embodiment associated with FIG. 1 except the recess 11. Therefore, repeated descriptions for the same component parts will be omitted herein, and the same terms and the same reference numerals will be used to refer to the same component parts.

Referring to FIG. 5, unlike the semiconductor device 1A in accordance with an embodiment described above with reference to FIGS. 1 and 2, the semiconductor device 1D in accordance with an embodiment further may include a recess 11 which is defined by etching one surface A of a scribe lane SL by a predetermined thickness.

In an embodiment, the recess 11 is defined in a line-like shape on the one surface A of the scribe lane SL along the lengthwise direction of the scribe lane SL.

A heat dissipation member 30 is filled in the recess 11. The heat dissipation member 30 may be formed to fill the recess 11 and project from the one surface A by a predetermined height D.

While it is illustrated in an embodiment shown in FIG. 5 that the recess 11 is defined on only the one surface A of the scribe lane SL, it can be envisaged that the recess 11 may be defined on the other surface B of the scribe lane SL or may be defined on both the one surface A and the other surface B of the scribe lane SL.

Figure 6:
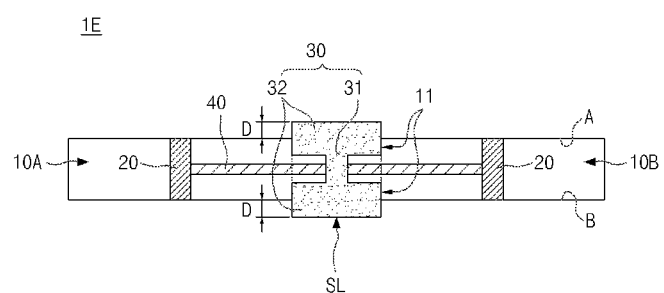
FIG. 6 is a cross-sectional view illustrating a semiconductor device in accordance with an embodiment.

A semiconductor device with a structure in which recesses 11 are defined on both one surface A and other surface B of a scribe lane SL will be apparent from the following descriptions given with reference to FIG. 6.

FIG. 6 is a cross-sectional view illustrating a semiconductor device in accordance with an embodiment.

The semiconductor device 1E in accordance with an embodiment has a construction where a recess 11 may be formed on not only one surface A but also the other surface B of a scribe lane SL in the construction of the semiconductor device 1D in accordance with an embodiment described above with reference to FIG. 5. Accordingly, the semiconductor device 1E in accordance with an embodiment associated with FIG. 6 has substantially the same construction as the semiconductor device 1D in accordance with an embodiment associated with FIG. 5 except for the recesses 11. Therefore, repeated descriptions for the same component parts will be omitted herein, and the same terms and the same reference numerals will be used to refer to the same component parts.

Referring to FIG. 6, in an embodiment, recesses 11 are defined on one surface A and the other surface B of a scribe lane SL.

A heat dissipation member 30 is filled in the recesses 11. The heat dissipation member 30 may be formed to fill the recesses 11 and project from the one surface A and the other surface B of the scribe lane SL by a predetermined height D.

According to the embodiments described with reference to FIGS. 5 and 6, the recess 11 is defined on the one surface A of the scribe lane SL or the recesses 11 are defined on the one surface A and the other surface B of the scribe lane SL, and the heat dissipation member 30 is filled in the recess 11 or the recesses 11. Therefore, since the volumes occupied by the heat dissipation member 30 in the semiconductor devices 1D and 1E increase by the volumes of the recess 11 or the recesses 11, improved heat dissipation characteristics may be accomplished.

Figure 7:
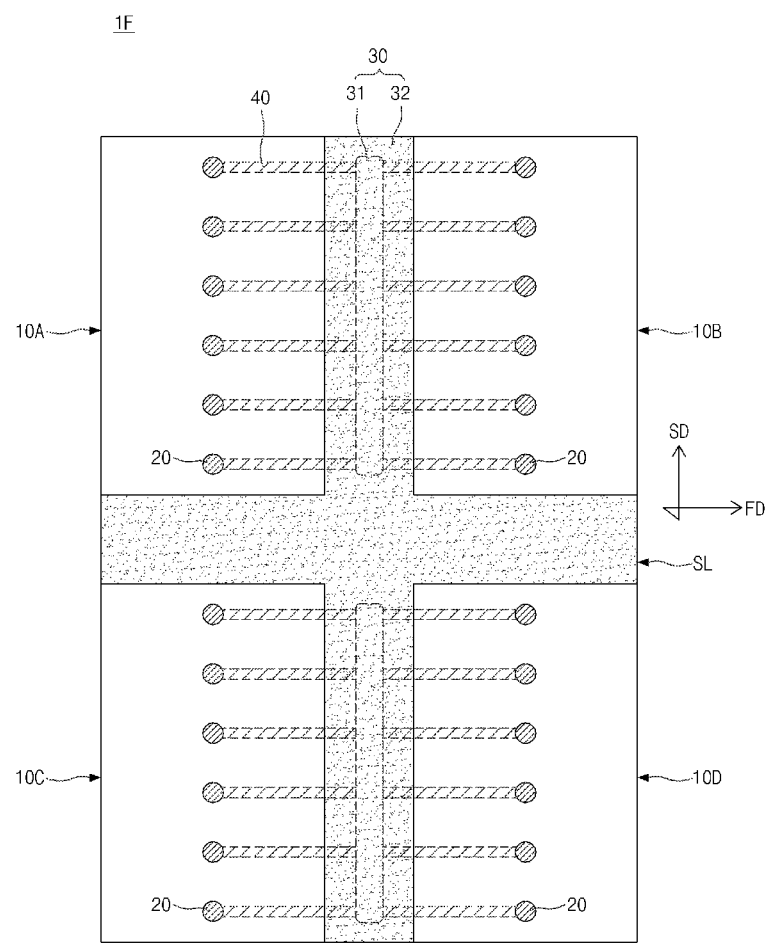
FIG. 7 is a plan view illustrating a semiconductor device in accordance with an embodiment.

FIG. 7 is a plan view illustrating a semiconductor device in accordance with an embodiment.

The semiconductor device 1F in accordance with an embodiment associated with FIG. 7 has a construction that a plurality of semiconductor chips 10A to 10D may be connected in a matrix type, unlike the semiconductor device 1C in accordance with an embodiment described above with reference to FIG. 4. Accordingly, the semiconductor device 1F in accordance with an embodiment associated with FIG. 7 has substantially the same construction as the semiconductor device 1C in accordance with an embodiment associated with FIG. 4 except the connection type of the semiconductor chips 10A to 10D. Therefore, repeated descriptions for the same component parts will be omitted herein, and the same terms and the same reference numerals will be used to refer to the same component parts.

Referring to FIG. 7, in an embodiment, the plurality of semiconductor chips 10A to 10D may include a first semiconductor chip 10A, a second semiconductor chip 10B, a third semiconductor chip 10C, and a fourth semiconductor chip 10D.

In an embodiment associated with FIG. 7, a scribe lane SL has a cross-like shape, and the first to fourth semiconductor chips 10A to 10D may be connected in the matrix type through the cross-shaped scribe lane SL.

Figure 8:
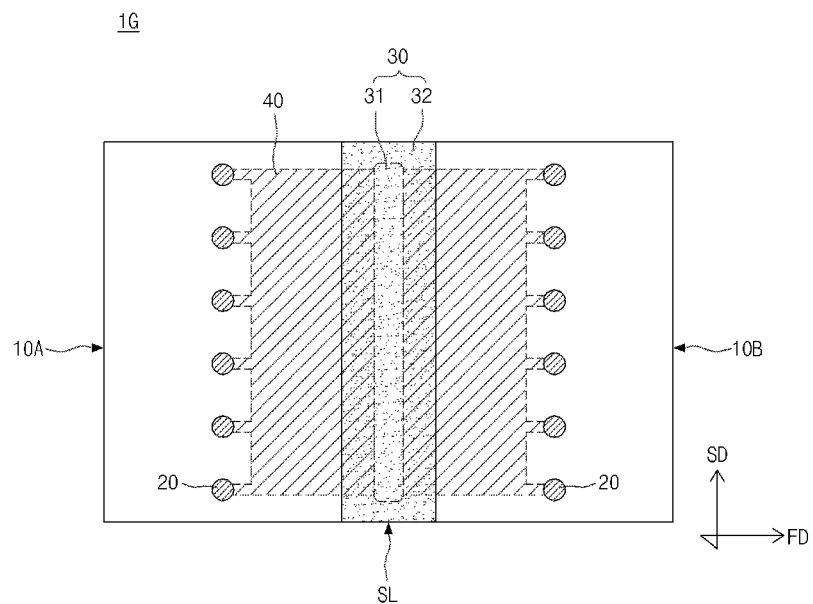
FIG. 8 is a plan view illustrating a semiconductor device in accordance with an embodiment.

FIG. 8 is a plan view illustrating a semiconductor device in accordance with an embodiment.

The semiconductor device 1G in accordance with an embodiment associated with FIG. 8 has a construction where the shape of the heat transfer members 40 is changed, unlike the semiconductor device 1C in accordance with an embodiment described above with reference to FIG. 4. Accordingly, the semiconductor device 1G in accordance with an embodiment associated with FIG. 8 has substantially the same construction as the semiconductor device 1C in accordance with an embodiment associated with FIG. 4 except for the heat transfer members 40. Therefore, repeated descriptions for the same component parts will be omitted herein, and the same terms and the same reference numerals will be used to refer to the same component parts.

Referring to FIG. 8, in an embodiment, a heat transfer member 40 may be formed as one member such that a plurality of through electrodes 20 formed in each of semiconductor chips 10A and 10B may be connected to a heat dissipation member 30 through the heat transfer member 40 all at once.

In order to prevent the through electrodes 20 for transferring different electrical signals from being electrically connected with one another, the heat transfer member 40 may be formed of a material with an insulation property and excellent heat transfer characteristics, for example, ceramic.

Hereafter, stacked semiconductor packages with the above-described semiconductor devices will be described.

Figure 9:
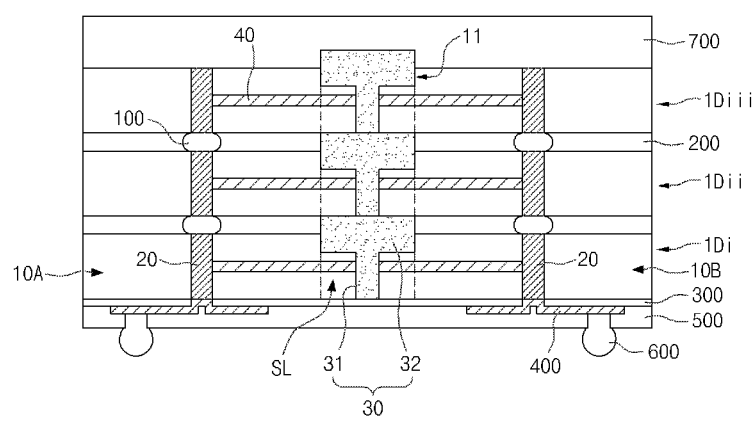
FIG. 9 is a cross-sectional view illustrating a stacked semiconductor package in accordance with an embodiment.

FIG. 9 is a cross-sectional view illustrating a stacked semiconductor package in accordance with an embodiment.

Referring to FIG. 9, after preparing a plurality of semiconductor devices 1Di to 1Diii each having through electrodes 20, a heat dissipation member 30 and heat transfer members 40, second semiconductor device 1Dii is stacked on first semiconductor device 1Di such that the through electrodes 20 of second semiconductor device 1Dii are electrically connected to the through electrodes 20 of the first semiconductor device 1Di and the heat dissipation member 30 of second semiconductor device 1Dii is connected to the heat dissipation member 30 of the first semiconductor device 1Di. In this way, a plurality of semiconductor devices, for example, three semiconductor devices 1Di to 1Diii may be stacked.

Connection members 100 may be formed between the through electrodes 20 of the stacked semiconductor devices 1Di to 1Diii to electrically connect the through electrodes 20 of the upper and lower semiconductor devices 1Di to 1Diii, and adhesive members 200 may be formed between the stacked semiconductor devices 1Di to 1Diii to attach the upper and lower semiconductor devices 1Di to 1Diii. The connection members 100 may include solders, and the adhesive members 200 may include non-conductive pastes.

A first insulation layer 300 may be formed on the lower surface of the lowermost semiconductor device 1Di among the stacked semiconductor devices 1Di to 1Diii to expose the through electrodes 20 of the lowermost semiconductor device 1Di, and redistribution lines 400 may be formed on the first insulation layer 300 to be electrically connected with the through electrodes 20 of the lowermost semiconductor device 1Di. A second insulation layer 500 may be formed on the first insulation layer 300 including the redistribution lines 400 to expose portions of the redistribution lines 400, and external connection terminals 600 are mounted to the portions of the redistribution lines 400 which are exposed through the second insulation layer 500.

An additional heat dissipation member 700 is mounted to the upper surface of the uppermost semiconductor device 1Diii among the stacked semiconductor devices 1Di to 1Diii.

Figure 10:
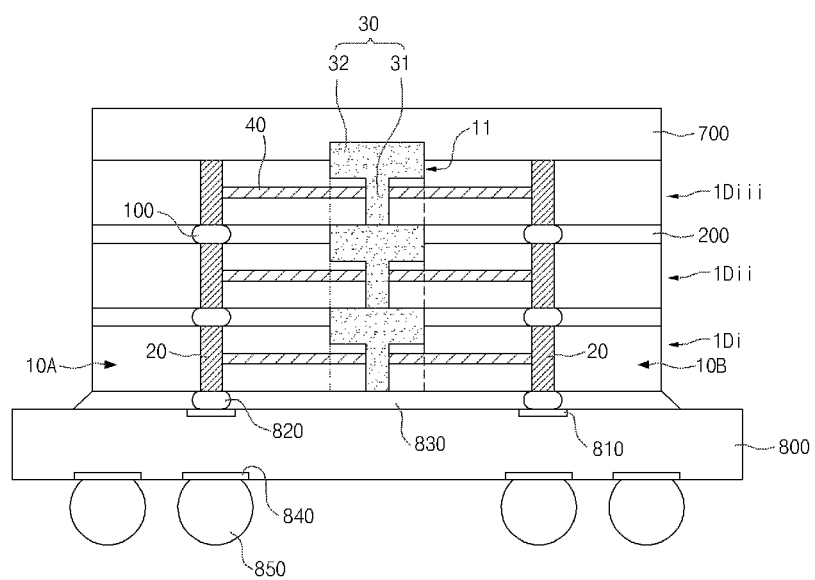
FIG. 10 is a cross-sectional view illustrating a stacked semiconductor package in accordance with an embodiment.

FIG. 10 is a cross-sectional view illustrating a stacked semiconductor package in accordance with an embodiment.

Referring to FIG. 10, after preparing a plurality of semiconductor devices 1Di to 1Diii each having through electrodes 20, a heat dissipation member 30 and heat transfer members 40, second semiconductor device 1Dii is stacked on first semiconductor device 1Di such that the through electrodes 20 of second semiconductor device 1Dii are electrically connected to the through electrodes 20 of the first semiconductor device 1Di and the heat dissipation member 30 of second semiconductor device 1Dii is connected to the heat dissipation member 30 of the first semiconductor device 1Di. In this way, a plurality of semiconductor devices, for example, three semiconductor devices 1Di to 1Diii are stacked.

Connection members 100 may be formed between the through electrodes 20 of the stacked semiconductor devices 1Di to 1Diii to electrically connect the through electrodes 20 of the upper and lower semiconductor devices 1Di to 1Diii, and adhesive members 200 may be formed between the stacked semiconductor devices 1Di to 1Diii to attach the upper and lower semiconductor devices 1Di to 1Diii. The connection members 100 may include solders, and the adhesive members 200 may include non-conductive pastes.

The stacked semiconductor devices 1Di to 1Diii are mounted to a structural body 800 such that the through electrodes 20 of the lowermost semiconductor device 1Di are electrically connected with connection electrodes 810 of the structural body 800. In an embodiment associated with FIG. 10, the structural body 800 may be formed as a printed circuit board (PCB).

The through electrodes 20 of the lowermost semiconductor device 1Di and the connection electrodes 810 of the structural body 800 are electrically connected with each other by connection members 820, and the lowermost semiconductor device 1Di and the structural body 800 are attached to each other by an adhesive member 830.

An additional heat dissipation member 700 is mounted to the upper surface of the uppermost semiconductor device 1Diii among the stacked semiconductor devices 1Di to 1Diii. The reference numeral 840 designates ball lands, and 850 external connection terminals which are mounted to the ball lands 840.

While it is illustrated in the stacked semiconductor package according to an embodiment described above with reference to FIG. 10 that the structural body 800 is constituted by a printed circuit board (PCB), it is to be noted that the structural body 800 may be constituted by a semiconductor package or an interposer. Such types of stacked semiconductor packages will become more apparent from the following descriptions taken in conjunction with FIGS. 11 and 12.

Figure 11:
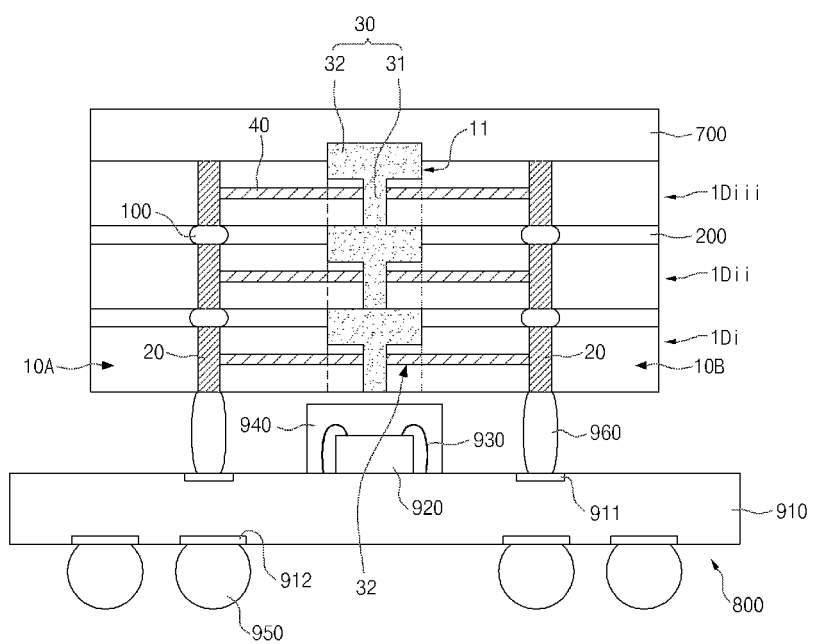
FIG. 11 is a cross-sectional view illustrating a stacked semiconductor package in accordance with an embodiment.

FIG. 11 is a cross-sectional view illustrating a stacked semiconductor package in accordance with an embodiment.

The stacked semiconductor package in accordance with an embodiment associated with FIG. 10 has a construction that the structural body 800 is constituted by a semiconductor package instead of the printed circuit board in the stacked semiconductor package in accordance with an embodiment described above with reference to FIG. 10. Accordingly, the stacked semiconductor package in accordance with an embodiment associated with FIG. 11 has substantially the same construction as the stacked semiconductor package in accordance with an embodiment associated with FIG. 10 except for the structural body 800. Therefore, the same terms and the same reference numerals will be used to refer to the same component parts.

Referring to FIG. 11, after preparing a plurality of semiconductor devices 1Di to 1Diii each having through electrodes 20, a heat dissipation member 30 and heat transfer members 40, second semiconductor device 1Dii is stacked on first semiconductor device 1Di such that the through electrodes 20 of second semiconductor device 1Dii are electrically connected to the through electrodes 20 of the first semiconductor device 1Di and the heat dissipation member 30 of second semiconductor device 1Dii is connected to the heat dissipation member 30 of the first semiconductor device 1Di. In this way, a plurality of semiconductor devices, for example, three semiconductor devices 1Di to 1Diii are stacked.

Connection members 100 may be formed between the through electrodes 20 of the stacked semiconductor devices 1Di to 1Diii to electrically connect the through electrodes 20 of the upper and lower semiconductor devices 1Di to 1Diii, and adhesive members 200 may be formed between the stacked semiconductor devices 1Di to 1Diii to attach the upper and lower semiconductor devices 1Di to 1Diii. The connection members 100 may include solders, and the adhesive members 200 may include non-conductive pastes.

The stacked semiconductor devices 1Di to 1Diii are mounted to a structural body 800 such that the through electrodes 20 of the lowermost semiconductor device 1Di are electrically connected with connection electrodes 911 of the structural body 800. In an embodiment associated with FIG. 11, the structural body 800 is constituted by a semiconductor package.

The semiconductor package may include a substrate 910 which has the connection electrodes 911 on the upper surface thereof and ball lands 912 on the lower surface thereof, and a semiconductor chip 920 which is attached to the upper surface of the substrate 910 inside the connection electrodes 911. The semiconductor chip 920 is electrically connected with the substrate 910 using wires 930, and is fixed by a molding part 940. The reference numeral 950 designates external connection terminals which are mounted to the ball lands 912 of the substrate 910.

The through electrodes 20 of the lowermost semiconductor device 1Di and the connection electrodes 911 of the structural body 800 are electrically connected by the medium of connection members 960. In an embodiment associated with FIG. 11, the connection members 960 may be formed as solder balls. Also, the connection members 960 may be formed as lead lines. An additional heat dissipation member 700 is mounted to the upper surface of the uppermost semiconductor device 1Diii among the stacked semiconductor devices 1Di to 1Diii.

Figure 12:
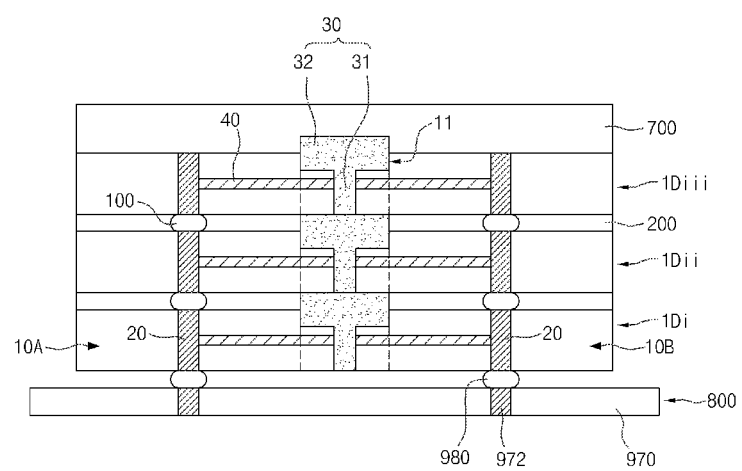
FIG. 12 is a cross-sectional view illustrating a stacked semiconductor package in accordance with an embodiment.

FIG. 12 is a cross-sectional view illustrating a stacked semiconductor package in accordance with an eleventh embodiment.

The stacked semiconductor package in accordance with the eleventh embodiment has a construction that the structural body 800 is constituted by an interposer instead of the printed circuit board in the stacked semiconductor package in accordance with the ninth embodiment described above with reference to FIG. 10. Accordingly, the stacked semiconductor package in accordance with the eleventh embodiment has substantially the same construction as the stacked semiconductor package in accordance with the ninth embodiment except the structural body 800. Therefore, the same terms and the same reference numerals will be used to refer to the same component parts.

Referring to FIG. 12, after preparing a plurality of semiconductor devices 1Di to 1Diii each having through electrodes 20, a heat dissipation member 30 and heat transfer members 40, second semiconductor device 1Dii is stacked on first semiconductor device 1Di such that the through electrodes 20 of second semiconductor device 1Dii are electrically connected to the through electrodes 20 of the first semiconductor device 1Di and the heat dissipation member 30 of second semiconductor device 1Dii is connected to the heat dissipation member 30 of the first semiconductor device 1Di. In this way, a plurality of semiconductor devices, for example, three semiconductor devices 1Di to 1Diii are stacked.

Connection members 100 may be formed between the through electrodes 20 of the stacked semiconductor devices 1Di to 1Diii to electrically connect the through electrodes 20 of the upper and lower semiconductor devices 1Di to 1Diii, and adhesive members 200 may be formed between the stacked semiconductor devices 1Di to 1Diii to attach the upper and lower semiconductor devices 1Di to 1Diii. The connection members 100 may include solders, and the adhesive members 200 may include non-conductive pastes.

The stacked semiconductor devices 1Di to 1Diii are mounted to a structural body 800 such that the through electrodes 20 of the lowermost semiconductor device 1Di are electrically connected with connection electrodes 972 of the structural body 800. In an embodiment associated with FIG. 12, the structural body 800 is constituted by an interposer.

The interposer may include an interposer body 970 and the connection electrodes 972 which pass through the interposer body 970. The through electrodes 20 of the lowermost semiconductor device 1Di and the connection electrodes 972 of the structural body 800 are electrically connected by the medium of connection members 980.

An additional heat dissipation member 700 is mounted to the upper surface of the uppermost semiconductor device 1Diii among the stacked semiconductor devices 1Di to 1Diii.

While not shown, after the stacked semiconductor devices 1Di to 1Diii are mounted to the interposer, the stacked semiconductor devices 1Di to 1Diii are mounted to another semiconductor structure, for example, a semiconductor package or a main board, by the medium of the interposer.

Although it was illustrated and explained in the embodiments described above with reference to FIGS. 9 to 12 that the stacked semiconductor packages are constructed by stacking a plurality of semiconductor devices 1D one of which is shown in FIG. 5, it is to be noted that the various embodiments are not limited to such. Thus, stacked semiconductor packages may be constructed by stacking in a plural number one of the semiconductor devices 1A to 1C and 1E to 1G which are shown in FIGS. 1 to 4 and 6 to 8, instead of using the semiconductor device 1D shown in FIG. 5, or stacked semiconductor packages may be constructed by stacking at least two kinds of semiconductor devices among the semiconductor devices shown in FIGS. 1 to 8.

The semiconductor device according to the various embodiments may be applied to various package modules.

Figure 13:
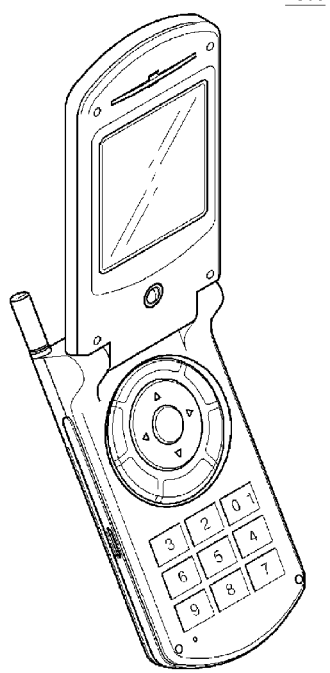
FIG. 13 is a perspective view illustrating an electronic apparatus having the semiconductor device according to various embodiments.

FIG. 13 is a perspective view illustrating an electronic apparatus having the semiconductor device according to the various embodiments.

Referring to FIG. 13, the semiconductor device according to the various embodiments may be applied to an electronic apparatus 1000 such as a portable phone. Since the semiconductor device according to the embodiments of the present invention may have an excellent heat dissipation characteristic, advantages are provided in improving the reliability of the electronic apparatus 1000. The electronic apparatus 1000 is not limited to the portable phone shown in FIG. 13, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 14:
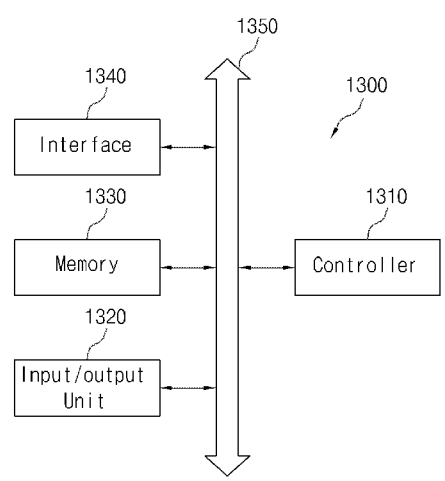
FIG. 14 is a block diagram showing an example of the electronic apparatus having the semiconductor device according to various embodiments.

FIG. 14 is a block diagram showing an example of the electronic apparatus having the semiconductor device according to the various embodiments.

Referring to FIG. 14, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data move. For example, the controller 1310 may include at least any one of at least one microprocessor, at least one digital signal processor, at least one microcontroller, and logic devices capable of performing the same functions as these components. The controller 1310 and the memory 1330 may include the semiconductor device according to the various embodiments. The input/output unit 1320 may include at least one selected among a keypad, a keyboard, a display device, and so forth. The memory 1330 is a device for storing data. The memory 1330 may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention may be applied may be mounted to an information processing system such as a mobile terminal or a desk top computer. The flash memory may be constituted by a solid state drive (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIS), an input/output unit, etc.

As is apparent from the above description, according to the various embodiments, since the heat generated from through electrodes may be quickly discharged to an outside through heat transfer members and a heat dissipation member, it is possible to prevent the performance and the reliability of a semiconductor device from being degraded.

Although various embodiments have been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
a plurality of semiconductor chips connected through a scribe lane;
a plurality of through electrodes formed in each of the plurality of semiconductor chips;
a heat dissipation member formed only in the scribe lane and formed of an insulative heat dissipation substance; and
a plurality of heat transfer members, each heat transfer member individually connecting a corresponding through electrode with the heat dissipation member, wherein one end of the each heat transfer member is connected to the through electrode in the semiconductor chip, and the other end of the each heat transfer member is connected to the heat dissipation member in the scribe lane,
wherein the heat dissipation member comprises:
through parts passing through one surface of the scribe lane and the other surface of the scribe lane which faces away from the one surface; and
a heat dissipation part formed over the scribe lane and connected with the through parts,
wherein the through parts are formed in a plural number such that the through parts are individually connected to the plurality of through electrodes which are formed in each of the plurality of semiconductor chips.

2. The semiconductor device according to claim 1, wherein the plurality of semiconductor chips and the scribe lane are connected in line along a first direction, and the plurality of through electrodes are formed in line in each of the semiconductor chips in a second direction perpendicular to the first direction.

3. The semiconductor device according to claim 1, wherein the plurality of semiconductor chips are connected in a matrix type.

4. The semiconductor device according to claim 1, wherein the heat dissipation part is formed over any one of the one surface and the other surface of the scribe lane.

5. The semiconductor device according to claim 4, further comprising:
a recess defined as at least any one of the one surface of the scribe lane and the other surface of the scribe lane facing away from the one surface is etched by a partial thickness.

6. The semiconductor device according to claim 5, wherein the recess is filled with the heat dissipation part.

7. The semiconductor device according to claim 1, wherein the heat dissipation part is connected with all of the plurality of through parts.

8. The semiconductor device according to claim 1, further comprising:
a recess defined as at least any one of the one surface of the scribe lane and the other surface of the scribe lane facing away from the one surface is etched by a partial thickness.

9. The semiconductor device according to claim 8, wherein the recess is filled with the heat dissipation part.

10. The semiconductor device according to claim 1, wherein the heat dissipation member projects from at least any one of the one surface of the scribe lane and the other surface of the scribe lane facing away from the one surface.

11. The semiconductor device according to claim 1, wherein the heat dissipation member comprises an aluminum nitride.

12. The semiconductor device according to claim 1, wherein the heat transfer members are formed in the semiconductor chips.

13. The semiconductor device according to claim 1, wherein the heat transfer members comprise any one of copper, a conductive alloy, and ceramic.

14. A stacked semiconductor package comprising:
semiconductor devices each including a plurality of semiconductor chips connected through a scribe lane, a plurality of through electrodes formed in each of the plurality of semiconductor chips, a heat dissipation member formed only in the scribe lane, and a plurality of heat transfer members where each heat transfer member individually connects a corresponding through electrode with the heat dissipation member, the semiconductor devices being stacked such that their through electrodes and heat dissipation members are connected with one another, wherein one end of the each heat transfer member is connected to the through electrode in the semiconductor chip, and the other end of the each heat transfer member is connected to the heat dissipation member in the scribe lane; and connection members electrically connecting the through electrodes of the stacked semiconductor devices, wherein the heat dissipation member comprises:

through parts passing through one surface of the scribe lane and the other surface of the scribe lane which faces away from the one surface; and a heat dissipation part formed over the scribe lane and connected with the through parts, wherein the through parts are formed in a plural number such that the through parts are individually connected to the plurality of through electrodes which are formed in each of the plurality of semiconductor chips.

15. The stacked semiconductor package according to claim 14, further comprising:

an additional heat dissipation member mounted to an uppermost semiconductor device among the stacked semiconductor devices.

16. The stacked semiconductor package according to claim 14, wherein the plurality of semiconductor chips and the scribe lane are connected in line along a first direction, and the plurality of through electrodes are formed in line in each of the semiconductor chips in a second direction perpendicular to the first direction.

* * * * *